United States Patent
Chung

(10) Patent No.: US 7,462,568 B2
(45) Date of Patent: Dec. 9, 2008

(54) METHOD FOR FORMING INTERLAYER DIELECTRIC FILM IN SEMICONDUCTOR DEVICE

(75) Inventor: Jie Won Chung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 153 days.

(21) Appl. No.: 11/139,057

(22) Filed: May 27, 2005

(65) Prior Publication Data

US 2006/0205202 A1    Sep. 14, 2006

(30) Foreign Application Priority Data

Mar. 14, 2005 (KR) .................. 10-2005-0020927

(51) Int. Cl.
*H01L 21/31* (2006.01)
*H01L 21/469* (2006.01)

(52) U.S. Cl. .............. 438/778; 438/787; 438/788; 438/475; 438/485; 438/FOR. 448

(58) Field of Classification Search .......... 438/710, 438/711, 720, 239–240, 253, 778, 485, 787, 438/788, 475, FOR. 448
See application file for complete search history.

(56) References Cited

U.S. PATENT DOCUMENTS

| | | | |
|---|---|---|---|
| 5,792,702 A * | 8/1998 | Liang | 438/624 |
| 6,297,114 B1 | 10/2001 | Iwata et al. | |
| 6,509,280 B2 | 1/2003 | Choi | |
| 2002/0039814 A1 * | 4/2002 | Jada et al. | 438/155 |
| 2003/0096504 A1 * | 5/2003 | Ryu et al. | 438/694 |

OTHER PUBLICATIONS

Cellere et al., "Different Nature of Process-Induced and Stress-Induced Defects in Thin $SiO_2$ Layers," IEEE Electron Device Letters, 24:393-395 (2003).

* cited by examiner

*Primary Examiner*—Phuc T Dang
*Assistant Examiner*—Thanh Y Tran
(74) *Attorney, Agent, or Firm*—Marshall, Gerstein & Borun LLP

(57) ABSTRACT

Disclosed herein is a method for forming an interlayer dielectric film in a semiconductor device. The method comprises the steps of preparing a semiconductor substrate having a dielectric film and conductive film patterns sequentially deposited thereon, and depositing a high plasma oxide film as the interlayer dielectric film on the conductive film patterns and the dielectric films by supplying $H_2$ as an adding gas together with a source gas. A dangling bond in an interface of the semiconductor substrate is reduced by adding hydrogen into the dielectric film, thereby enhancing the uniformity of the deposition. Moreover, hydrogen in the dielectric film decreases current leakage occurring in the gate by preventing electrons in the plasma from flowing into a gate through the bit-line, thereby enhancing the refresh characteristics of the semiconductor device.

11 Claims, 4 Drawing Sheets

METHOD FOR FORMING INTERLAYER DIELECTRIC FILM IN SEMICONDUCTOR DEVICE

BACKGROUND OF THE INVENTION

1. Field of the Invention

The present invention generally relates to a method for manufacturing a semiconductor device, and, more particularly, to a method for forming an interlayer dielectric film of a semiconductor device.

2. Description of the Related Art

Recently, as semiconductor diodes have become highly integrated, resulting in a gradual decrease in the design rule thereof, the gap between conductive patterns has also been narrowed. As a result, an importance of a gap-filling method for completely filling the gap between conductive patterns with an interlayer dielectric film covering the conductive patterns is emphasized. Generally, the interlayer dielectric film is formed by a chemical vapor deposition (CVD) process. When forming the interlayer dielectric film by use of a typical CVD process, an additional process of heat treating a wafer at a high temperature is performed after depositing the interlayer dielectric film in order to completely fill the fine gap formed between the conductive patterns without creating a void. However, when heating the wafer at a temperature of 850° C., the characteristics of the semiconductor diode are deteriorated.

Accordingly, processes of depositing an interlayer dielectric film, which can maximize its ability of filling the gap between metallic wires and is simple, have been suggested. On of such processes is a method for forming the interlayer dielectric film with a High Density Plasma (HDP) oxide film. With the method for forming the interlayer dielectric film with the HDP oxide film, after high density plasma is generated, a source gas supplied from the outside is ionized by the plasma, and is then chemically reacted with a wafer, whereby the interlayer dielectric film is deposited thereon. At this time, the process of depositing the HDP oxide film, and a process of etching the HDP oxide film are repeatedly performed so as to completely fill the narrow gap between the conductive patterns with the HDP oxide film.

However, the method as described above has problems in that the wafer is damaged by the plasma during the process of forming the HPD oxide film, and in that the wafer is further damaged by the other plasma processes subsequently performed thereafter or that the refresh property is lowered in the case of a semiconductor memory device, such as a dynamic random access memory (DRAM), due to current leakage caused by a hump property.

FIGS. 1 to 3 are cross-sectional views illustrating a conventional method for forming an interlayer dielectric film of a semiconductor device.

First, as shown in FIG. 1, a first interlayer dielectric film 110 is located on a semiconductor substrate 100 having an active region restricted by a trench isolation layer 102. A plurality of bit-line stacks 120 is located and spaced from each other on the first interlayer dielectric film 110. In some cases, other conductive patterns may be provided thereon. Each of the bit-line stacks 120 comprises a barrier pattern 121, a metallic film pattern 122 and a hard-mask film pattern 123, which are sequentially stacked. The barrier pattern 121 may be formed of a titanium/titanium nitride (Ti/TiN) film, and the metallic film pattern 122 may be formed of a tungsten (W) film. The hard-mask film pattern 123 may be formed of a nitride film. Each bit-line stack 120 is provided at either side with a bit-line spacer film 130.

Then, as shown in FIG. 2, an HDP oxide film 140 is formed as a second interlayer dielectric film on the first interlayer dielectric film 110 and the bit-line stacks 120 by use of a high density plasma apparatus. For this purpose, after loading the semiconductor structure of FIG. 1 into a chamber of the high density plasma apparatus, $SiH_4$ as a source gas, and He as an added gas are supplied into the chamber together with the application of appropriate source power, thereby forming plasma 150 within the chamber. Then, an appropriate bias power is applied into the chamber such that ions excited into the plasma 150 are deposited onto a wafer, thereby allowing the HDP oxide film 140 to be deposited on the dielectric film 110 and the bit-line stacks 120. As this process is performed until the HDP oxide film 140 completely covers the bit-line stacks 120, the HDP oxide film 140 is formed as the second interlayer dielectric film. Although not shown in the drawings, an etching process is performed on the HDP oxide film 140 during the process described above.

However, with the conventional method for forming the interlayer dielectric film, a dangling bond may be formed in a boundary plane between the trench isolation layer 102 and the semiconductor substrate 100 due to the plasma. Since the dangling bond can have a negative influence on the characteristics of the semiconductor device, such as an increase in the current leakage, a subsequent $H_2/N_2$ annealing process must be performed in order to prevent such a phenomenon. Moreover, during the process of forming the HDP oxide film 140, carriers, for example electrons, can be accumulated in a gate oxide film through the metallic wires due to the plasma, and in this case, the current leakage is created at a lower gate, thereby deteriorating the refresh characteristic of the device.

SUMMARY OF THE INVENTION

The present invention has been made to solve the above problems, and it is an object of the present invention to provide a method for forming an interlayer dielectric film in a semiconductor device, which suppresses an increase in current leakage of a semiconductor device due to plasma, thereby enhancing electric properties of the device.

In accordance with an aspect of the present invention, the above and other objects can be accomplished by the provision of a method for forming an interlayer dielectric film in a semiconductor device, comprising the steps of: preparing a semiconductor substrate having a dielectric film and conductive film patterns sequentially deposited thereon; and depositing a high plasma oxide film as the interlayer dielectric film on the conductive film patterns and the dielectric films by supplying $H_2$ as an adding gas together with a source gas.

The conductive film patterns may comprise a bit-line stack or a gate stack.

Depositing of the high plasma oxide film may be performed via supplying He together with $H_2$ as an adding gas.

A mixing ratio of $H_2$ to He is in the range of 4~5% in terms of flux.

Depositing of the high plasma oxide film may be performed by supplying $SiH_4$ and $O_2$ as the source gas.

$SiH_4$, $O_2$, He, and $H_2$ are supplied with the flux of 60~80 sccm, 80~100 sccm, 450~550 sccm, and 10~30 sccm, respectively.

Depositing of the high plasma oxide film may be performed using a source power of 3,000~4,000 W in a low frequency for generating plasma, and a bias power of 1,950~2,400 W in a high frequency.

Depositing of the high plasma oxide film may be performed by supplying Ar together with $H_2$ as an adding gas.

A mixing ratio of $H_2$ to Ar is in the range of 4~5% in terms of flux.

In this case, $SiH_4$, $O_2$, Ar, and $H_2$ are supplied with the flux of 60~80 sccm, 80~100 sccm, 450~550 sccm, and 10~30 sccm.

Depositing of the high plasma oxide film may be performed using a source power of 3,000~4,000 W in a low frequency for generating plasma, and a bias power of 1,950~2,400 W in a high frequency.

Depositing of the high plasma oxide film may be performed at a temperature of 200~500° C.

The method may further comprising the step of injecting He ions at a pressure of 2.7~3.3 Torr towards the backside of the semiconductor substrate.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Figure 1:
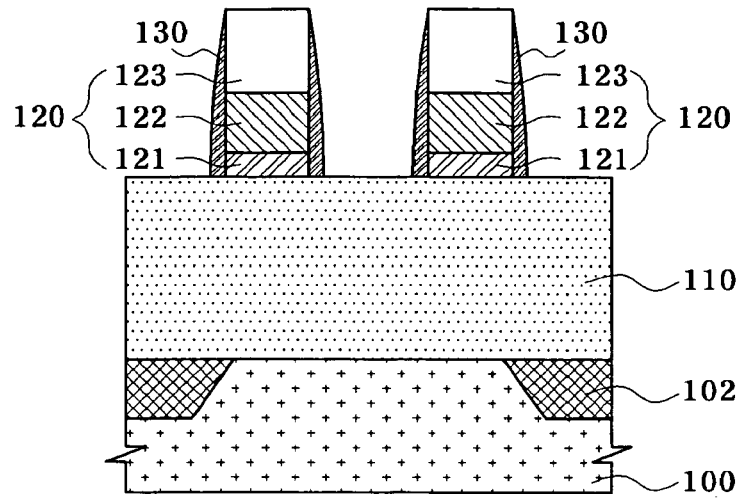
FIGS. 1 to 3 are cross-sectional views illustrating a conventional method for forming an interlayer dielectric film of a semiconductor device.
Figure 2:
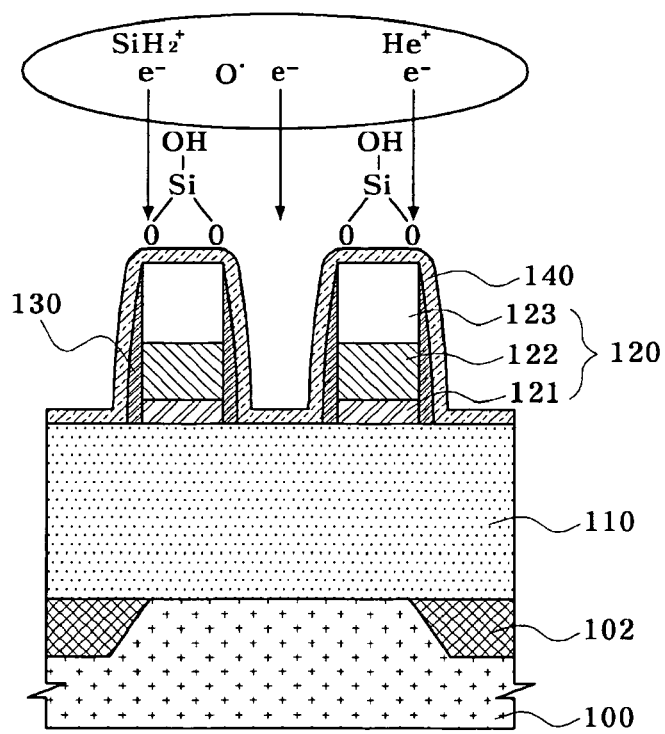
Figure 3:
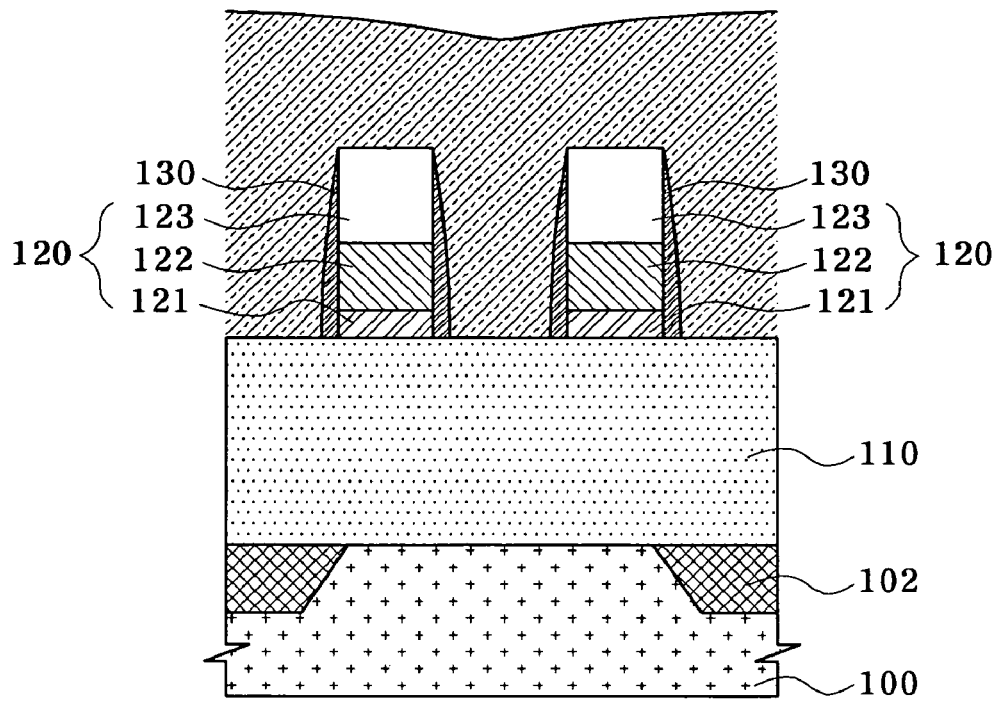

Reference will now be made in detail to the embodiments of the present invention with reference to the accompanying drawings. It should be appreciated that the present invention can be realized in various shapes, and is not limited to the embodiment described herein. In the drawings, components are enlarged for clear description, and like components are denoted by like reference numerals throughout.

FIGS. 4 to 8 are cross-sectional views illustrating a method for forming an interlayer dielectric film in a semiconductor device according to the present invention.

Figure 4:
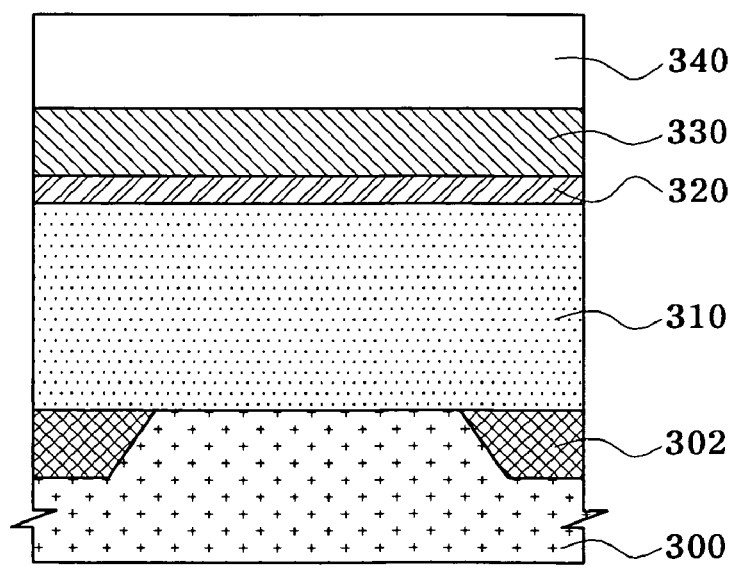
FIGS. 4 to 8 are cross-sectional views illustrating a method for forming an interlayer dielectric film of a semiconductor device according to the present invention.

First, referring to FIG. 4, a first interlayer dielectric film 310 is located on a semiconductor substrate 300 having an active region restricted by a trench isolation layer 302. Then, a titanium/titanium nitride (Ti/TiN) layer is deposited as a barrier layer 320 on the first interlayer dielectric film 310, and a tungsten (W) layer is deposited as a metallic layer 330 on the barrier layer 320. Then, a nitride layer is deposited as a hard mask film 340 on the metallic layer 330.

Figure 5:
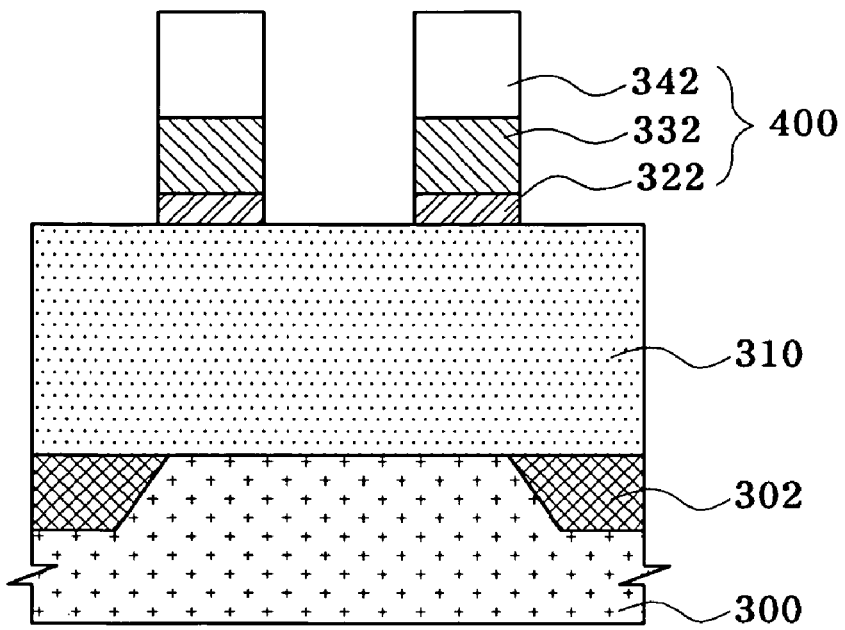

Then, as shown in FIG. 5, bit line stacks 400, each comprising a barrier layer pattern 322, a metallic layer pattern 332 and a hard-mask film pattern 342 sequentially stacked, are formed by patterning the barrier layer 320, the metallic layer 330 and the hard-mask film 340 using a bit-line mask (not shown).

Figure 6:
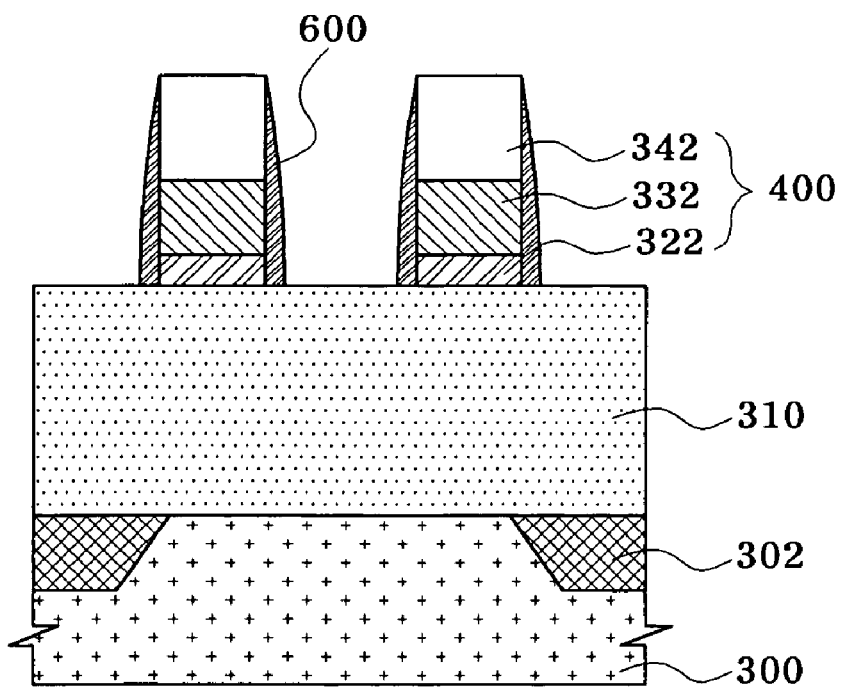

Then, as shown in FIG. 6, a nitride film for a spacer is deposited on the first interlayer dielectric film 310 and the bit line stacks 400. Anisotropic etching is performed on the nitride film for the spacer to form a bit-line spacer film 600 formed of the nitride film on each side wall of the bit line stacks 400.

Figure 7:
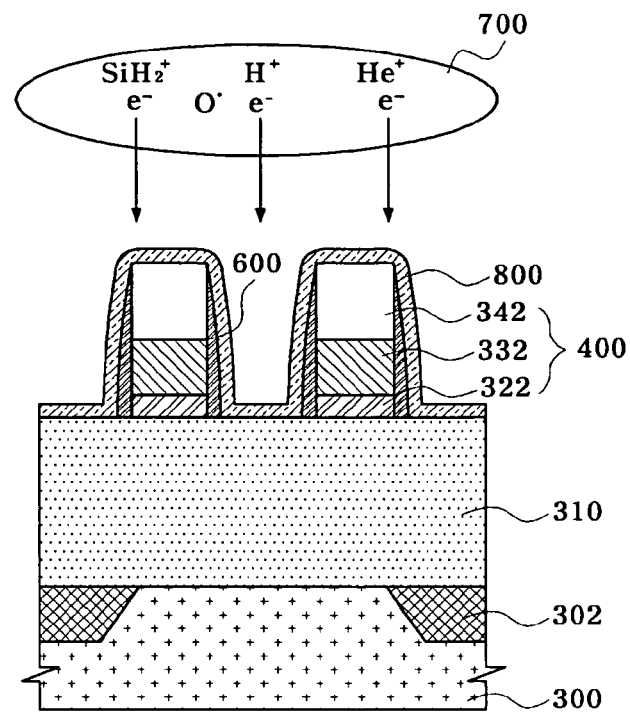
Figure 8:
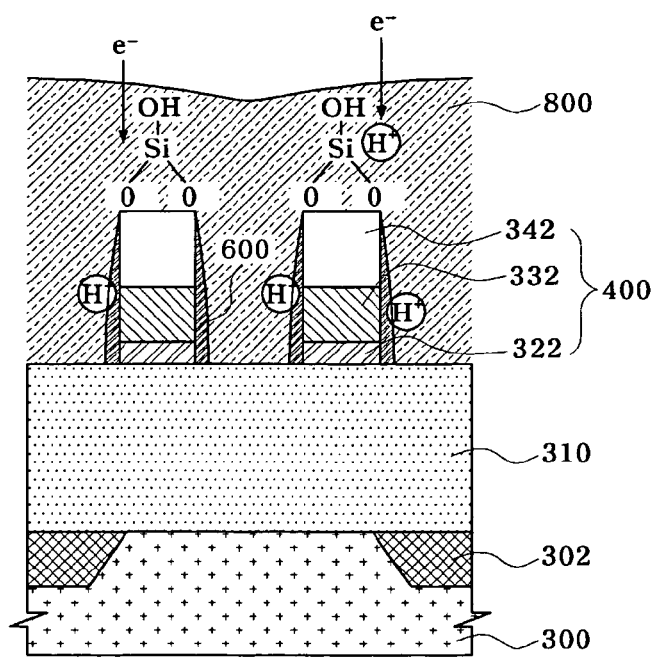

Then, as shown in FIG. 7, an HDP oxide film 800 is formed as a second interlayer dielectric film on the first interlayer dielectric film 310 and the bit-line stacks 400 within a high density plasma chamber at a temperature of 200~300° C. For this purpose, after loading the semiconductor structure of FIG. 6 into the high density plasma chamber, $SiH_4$ and $O_2$ as source gases, and He and $H_2$ as adding gases are supplied into the chamber together with application of an appropriate source power, thereby forming plasma 700 within the high density plasma chamber. Then, an appropriate bias power is applied to the chamber such that ions excited into the plasma 150 are deposited onto a wafer and chemically reacted, thereby allowing the HDP oxide film 800 to be deposited on the first interlayer dielectric film 310 and the bit-line stacks 400.

In this case, during the deposition process as described above, silane ($SiH_4$), oxygen ($O_2$), helium (He), and hydrogen ($H_2$) are supplied with the flux of 60~80 sccm, 80~100 sccm, 450~550 sccm, and 10~30 sccm in which the ratio of $H_2$ to He is in the range of about 4~5% in terms of flux. Moreover, a source power for generating the plasma is 3,000~4,000 W in a low frequency, and a bias power applied into a susceptor is 1,950~2,400 W in a high frequency. In particular, when $H_2$ is used in the mixing ratio of 4%, the ability of gap-filling of the interlayer dielectric film is enhanced, resulting in excellent uniformity of the interlayer dielectric film, and excellent distribution of electrical properties of the wafer, thereby providing a uniform chip. In some cases, when depositing the interlayer dielectric film of the semiconductor device, argon (Ar) may be used instead of He.

As these processes are performed until the HDP oxide film 800 completely covers the bit-line stacks 400, the HDP oxide film 800 is formed as the second interlayer dielectric film. Although not shown in the drawings, an etching process is performed on the HDP oxide film 800 during the processes as described above.

The HDP oxide film 800 formed as described above comprises a plurality of hydrogen ions ($H^+$). Accordingly, during a subsequent process using the plasma, electrons ($e^-$) present in the plasma are prevented from being injected into the oxide film or from flowing into the oxide film through the metallic wires or the bit lines during a subsequent annealing process performed at a high temperature by virtue of hydrogen ions ($H^+$) present in the HDP oxide film 800, thereby suppressing the occurrence of current leakage in a gate. Additionally, since hydrogen ($H_2$) has a high mobility due to its small size, it is coupled with a dangling bond present in the boundary plane of the semiconductor substrate 300 and a trench isolation layer 302. As a result, hydrogen reduces the dangling bond which can have a negative influence on the properties of the semiconductor device, such as an increase in the current leakage, thereby reducing the current leakage in the semiconductor substrate 300. Additionally, hydrogen prevents an interface of the hard-mask nitride film 340 or the bit-line space film 600 from being damaged by sputtering performed for the etching process during the process of depositing the HDP oxide film 800.

Meanwhile, when depositing the HDP oxide film 800 by use of the high density plasma at a temperature of 200~500° C., inert gas, for example, helium (He) is injected towards the backside of the wafer at a pressure of 2.7~3.3 Torr in order to further reduce the temperature of the wafer. With regard to this, when the deposition is performed at a high temperature, a gap between a valence band and a conduction band of a gate dielectric film which becomes thin due to reduction in the size of the semiconductor device, is reduced, so that when the electrons ($e^-$) present in the plasma infiltrate the gate dielectric film through the bit-lie, the electrons excite from the balance band to the conduction band of the gate dielectric film, whereby the breakdown voltage of the gate dielectric film is varied. At this time, if the helium ions are injected into the backside of the wafer, the temperature increase of the wafer can be avoided, whereby the variation in the breakdown voltage of the gate dielectric film caused by the high temperature can be suppressed. Additionally, although the high density plasma process performed at a temperature of 450~500° C. can enhance the refresh characteristics of the semiconductor device, the high density plasma process performed at a temperature of 200~300° C. can enhance not only the refresh characteristics of the semiconductor device but also a plasma induced damage (PID) phenomenon where as the size of the pattern in the device is decreased, the damage to the device is increased during the plasma process.

As apparent from the above description, according to the present invention, the dangling bond present in the interface of the semiconductor substrate is reduced by adding hydrogen into the dielectric film during the process of forming the dielectric film using the high density plasma, thereby enhancing the uniformity of the deposition. Moreover, hydrogen present in the dielectric film decreases the current leakage occurring in the gate by preventing the electrons present in the plasma from flowing into the gate through the bit-line, thereby enhancing the refresh characteristics.

It should be understood that the embodiments and the accompanying drawings have been described for illustrative purposes and the present invention is limited only by the following claims. Further, those skilled in the art will appreciate that various modifications, additions and substitutions are allowed without departing from the scope and spirit of the invention as set forth in the accompanying claims.

What is claimed is:

1. A method for forming an interlayer dielectric film in a semiconductor device, comprising:
    preparing a semiconductor substrate having a dielectric film and conductive film patterns sequentially deposited thereon; and,
    depositing a high density plasma oxide film as an interlayer dielectric film over the conductive film patterns and the dielectric film, wherein depositing the high density plasma oxide film comprises supplying a source gas and He gas, the source gas comprising hydrogen atoms, and supplying an additional source of hydrogen comprising $H_2$ gas, wherein a mixing ratio of $H_2$ gas to He gas is in the range of 4% to 5% in terms of flux.

2. The method according to claim 1, wherein the conductive film patterns comprise one of a bit-line stack or a gate stack.

3. The method according to claim 1, wherein the source gas comprises $SiH_4$ gas and $O_2$ gas.

4. The method according to claim 3, comprising supplying $SiH_4$, $O_2$, He, and $H_2$ with the flux at respective rates of 60~80 sccm, 80~100 sccm, 450~550 sccm, and 10~30 sccm.

5. The method according to claim 1, comprising depositing the high density plasma oxide film using a source power of 3,000 W~4,000 W in a low frequency for generating plasma, and a bias power of 1,950 W~2,400 W in a high frequency.

6. The method according to claim 1, wherein depositing the high density plasma oxide film further comprises supplying Ar gas.

7. The method according to claim 6, wherein a mixing ratio of $H_2$ to Ar is in the range of 4~5% in terms of flux.

8. The method according to claim 6, wherein the source gas comprises $SiH_4$ gas and $O_2$ gas and said method comprises supplying $SiH_4$, $O_2$, Ar, and $H_2$ with the flux at respective rates of 60~80 sccm, 80~100 sccm, 450~550 sccm, and 10~30 sccm.

9. The method according to claim 6, wherein depositing the high density plasma oxide film using a source power of 3,000 W~4,000 W in a low frequency for generating plasma, and a bias power of 1,950 W~2,400 W in a high frequency.

10. The method according to claim 1, comprising depositing the high density plasma oxide film at a temperature of 200° C.~500° C.

11. The method according to claim 1, further comprising injecting He ions at a pressure of 2.7 Torr~3.3 Torr towards a backside of the semiconductor substrate opposite the side of the semiconductor substrate on which the dielectric film, conductive film patterns, and interlayer dielectric film are formed.

* * * * *